(12) United States Patent
Ohse et al.

(10) Patent No.: US 10,374,080 B2
(45) Date of Patent: Aug. 6, 2019

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Naoyuki Ohse, Matsumoto (JP); Yusuke Kobayashi, Tsukuba (JP); Takahito Kojima, Matsumoto (JP); Shinsuke Harada, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/943,696

(22) Filed: Apr. 2, 2018

(65) Prior Publication Data
US 2018/0308975 A1 Oct. 25, 2018

(30) Foreign Application Priority Data
Apr. 20, 2017 (JP) .................... 2017-084063

(51) Int. Cl.
| | |
|---|---|
| *H01L 29/78* | (2006.01) |
| *H01L 29/66* | (2006.01) |
| *H01L 29/417* | (2006.01) |
| *H01L 29/47* | (2006.01) |
| *H01L 29/16* | (2006.01) |

(Continued)

(52) U.S. Cl.
CPC ...... *H01L 29/7813* (2013.01); *H01L 29/0623* (2013.01); *H01L 29/1608* (2013.01); *H01L 29/41766* (2013.01); *H01L 29/47* (2013.01); *H01L 29/66068* (2013.01); *H01L 29/7806* (2013.01); *H01L 29/872* (2013.01)

(58) Field of Classification Search
CPC ............. H01L 29/8128; H01L 29/0623; H01L 29/1095; H01L 29/1608; H01L 29/407; H01L 29/41766; H01L 29/42368; H01L 29/47; H01L 29/66068; H01L 29/66727; H01L 29/66734; H01L 29/7806; H01L 29/7811; H01L 29/7813; H01L 29/872
See application file for complete search history.

(56) References Cited

U.S. PATENT DOCUMENTS

| | | | |
|---|---|---|---|
| 5,614,749 A | 3/1997 | Ueno | |
| 8,252,648 B2 * | 8/2012 | Lee | .................. H01L 29/41766 438/270 |

(Continued)

FOREIGN PATENT DOCUMENTS

| | | |
|---|---|---|
| JP | H08-204179 A | 8/1996 |
| JP | 2008-177335 A | 7/2008 |

*Primary Examiner* — Eric A. Ward
(74) *Attorney, Agent, or Firm* — Rabin & Berdo, P.C.

(57) ABSTRACT

On a front surface of a semiconductor base, an $n^-$-type drift layer, a p-type base layer, an $n^{++}$-type source region, and a gate trench and a contact trench penetrating the $n^{++}$-type source region and the p-type base layer and reaching the $n^-$-type drift layer are provided. The contact trench is provided separated from the gate trench. A Schottky metal is embedded in the contact trench and forms a Schottky contact with the $n^-$-type drift layer at a side wall of the contact trench. An ohmic metal is provided at a bottom of the contact trench and forms an ohmic contact with the $n^-$-type drift layer.

5 Claims, 11 Drawing Sheets

(51) Int. Cl.
*H01L 29/872* (2006.01)
*H01L 29/06* (2006.01)

(56) References Cited

U.S. PATENT DOCUMENTS

| | | | | |
|---|---|---|---|---|
| 8,643,091 B2* | 2/2014 | Saito | ............... | H01L 29/7839 |
| | | | | 257/330 |
| 8,836,024 B2* | 9/2014 | Padmanabhan | ... | H01L 29/41766 |
| | | | | 257/334 |
| 10,164,020 B2* | 12/2018 | Chun | ............... | H01L 21/0445 |
| 2008/0173876 A1 | 7/2008 | Ueno | | |

* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2017-084063, filed on Apr. 20, 2017, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Insulated gate type metal oxide semiconductor field effect transistors (MOSFETs) sustaining voltages of 400V, 600V, 1200V, 1700V, 3300V, 6500V or higher are commonly known power semiconductor devices. For example, insulated gate type MOSFETs that use silicon carbide (SiC) (hereinafter, SiC-MOSFETs) are employed in power converting equipment such as converters and inverters. There is demand for these power semiconductor devices to have low loss and high efficiency while at the same time reduce leak current in an OFF state, facilitate size reductions, and improve reliability.

A vertical MOSFET has, as a body diode between the source and drain, an internal parasitic pn diode formed by a p-type base layer and an n-type drift layer. Therefore, a freewheeling diode (FWD) used in an inverter may be omitted, contributing to reductions in cost and size. Nonetheless, when a silicon carbide substrate is used as a semiconductor substrate, compared to a case where a silicon (Si) substrate is used, the parasitic pn diode has a high built-in potential whereby the ON resistance of the parasitic pn diode increases, leading to increased loss. Further, when the parasitic pn diode is turned on and current passes through, characteristics change over time (aging) and reliability decreases due to bipolar operation of the parasitic pn diode.

To address this problem, in a circuit, a Schottky barrier diode (SBD) is connected in parallel to a MOSFET, whereby at the time of flyback, current flows in the SBD, enabling a state where current does not flow through the parasitic pn diode. Nonetheless, cost increases because the number of SBD chips required is approximately equal to that of the MOSFETs.

Therefore, since connection of the SBD to an n-type drift layer and a source electrode is necessary, a technique has been proposed where a trench contact that penetrates a p-type channel part is formed at a substrate surface and the SBD is incorporated at a trench inner wall, whereby current at the time of flyback flows through the built-in SBD and not a PiN diode (for example, refer to Japanese Laid-Open Patent Publication No. H8-204179).

Figure 12:
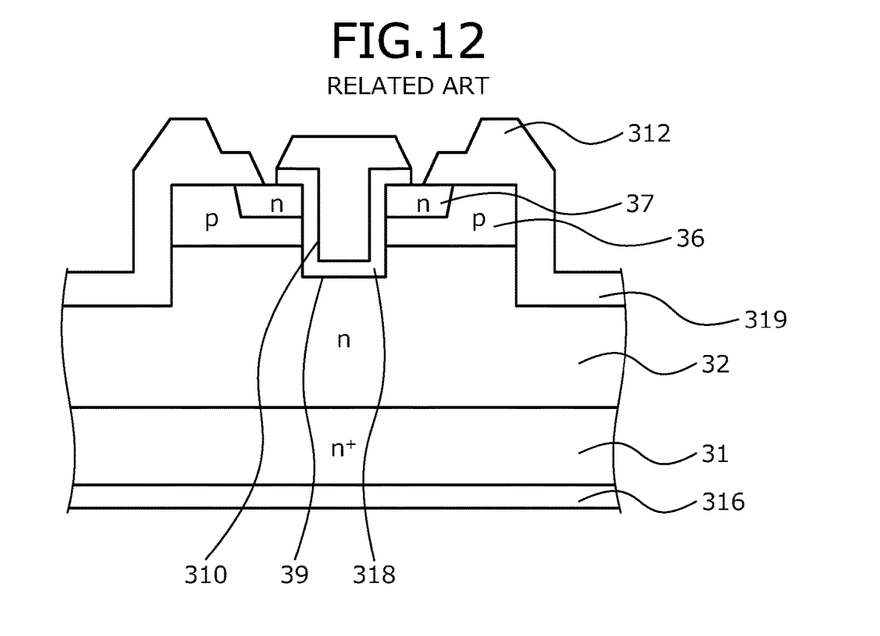
FIG. 12 is a cross-sectional view of a structure of a conventional silicon carbide semiconductor device with a built-in SBD.

FIG. 12 is a cross-sectional view of a structure of a conventional silicon carbide semiconductor device with a built-in SBD. As depicted in FIG. 12, a conventional example includes on a front surface of an $n^+$-type silicon carbide substrate 31, a trench-type MOS gate (insulated gate using a metal-oxide-film semiconductor material) structure and a contact trench 319. More specifically, an $n^-$-type layer constituting an $n^-$-type drift layer 32 is formed by epitaxial growth on an $n^+$-type silicon carbide substrate 31. On the front surface (surface facing the $n^-$-type drift layer 32) side of the $n^+$-type silicon carbide substrate 31, a MOS gate structure is provided constituted by a p-type base layer 36, an $n^{++}$-type source region 37, a gate trench 318, a gate insulating film 39, and a gate electrode 310.

Further, on a rear surface of the $n^+$-type silicon carbide substrate 31, a drain electrode 316 is provided. The contact trench 319 is a trench that is covered by a Schottky metal connecting the inner wall to a source electrode 312. The contact trench 319 forms a Schottky junction of a semiconductor region exposed at the inner wall and the Schottky metal. In this manner, in FIG. 12, between the source and drain, a parasitic Schottky diode is provided in parallel with a parasitic pn diode.

When positive voltage is applied to the source electrode 312 and negative voltage is applied to the drain electrode 316 (when the MOSFET is OFF), a pn junction between the p-type base layer 36 and the $n^-$-type drift layer 32 is forward biased. In FIG. 12, design is such that when the MOSFET is OFF, the parasitic Schottky diode turns ON before the parasitic pn diode turns ON, whereby bipolar operation of the parasitic pn diode is suppressed, enabling aging due to the bipolar operation to be prevented.

In the conventional silicon carbide semiconductor device depicted in FIG. 12, since the SBD is built-in, without a need for an external SBD, cost reductions are possible. Further, since the contact trench 319 is provided and the SBD is formed at a trench side wall, built-in SBDs may be formed at a higher density than in a planar-type SBD, enabling reductions in cell pitch, ON resistance and forward loss. Further, since the built-in SBD works as a body diode, body diode degradation and reduced loss at the time of flyback are possible.

Further, a technique has been disclosed where contact with a source electrode at a surface is made using a conductive material such as an aluminum (AD/titanium (Ti)/nickel (Ni)/gold (Au) film coating or a metal electrode containing tungsten (W), etc. embedded in a trench that is for contact (for example, refer to Japanese Laid-Open Patent Publication No. 2008-177335).

SUMMARY OF THE INVENTION

According to an embodiment of the invention, a semiconductor device includes a semiconductor substrate of a first conductivity type; a first semiconductor layer of the first conductivity type provided on a front surface of the semiconductor substrate; a second semiconductor layer of a second conductivity type provided on a first side of the first semiconductor layer opposite a second side of the first semiconductor layer facing the semiconductor substrate; a first semiconductor region of the first conductivity type selectively provided in the second semiconductor layer, an impurity concentration of the first semiconductor region being higher than an impurity concentration of the semiconductor substrate; a first trench penetrating the first semiconductor region and the second semiconductor layer, and reaching the first semiconductor layer; a gate electrode provided in the first trench, on a gate insulating film; an interlayer insulating film provided on the gate electrode; a first electrode in contact with the first semiconductor region and the second semiconductor layer; a second electrode provided on a rear surface of the semiconductor substrate; a second trench provided separated from the first trench, the second trench penetrating the first semiconductor region and the second semiconductor layer, and reaching the first semiconductor layer; and a metal electrode embedded in the second trench, the metal electrode forming a Schottky contact with the first semiconductor layer at a side wall of the second trench.

In the embodiment, the metal electrode occupies at least 30% of an internal volume of the second trench.

In the embodiment, the metal electrode is embedded from a bottom of the second trench to at least an interface of the second semiconductor layer and the first semiconductor region.

In the embodiment, the semiconductor device further includes a second metal electrode forming an ohmic contact with the first semiconductor layer at a bottom of the second trench.

In the embodiment, the metal electrode protrudes outwardly from the second trench.

In the embodiment, the metal electrode protrudes outwardly from the second trench and covers the interlayer insulating film and the first electrode.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the related arts will be described. In the conventional silicon carbide semiconductor device, reduction of a width of the contact trench is effective to further reduce the cell pitch and ON resistance. However, when the width of the contact trench is reduced, there may be instances where coverage of a Schottky barrier metal in the contact trench is degraded and the built-in SBD is not formed at a side wall of the contact trench. In this instance, a problem arises in that the built-in SBD does not work as a body diode and as a result, body diode degradation and loss at the time of flyback cannot be prevented.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described.

Figure 1:
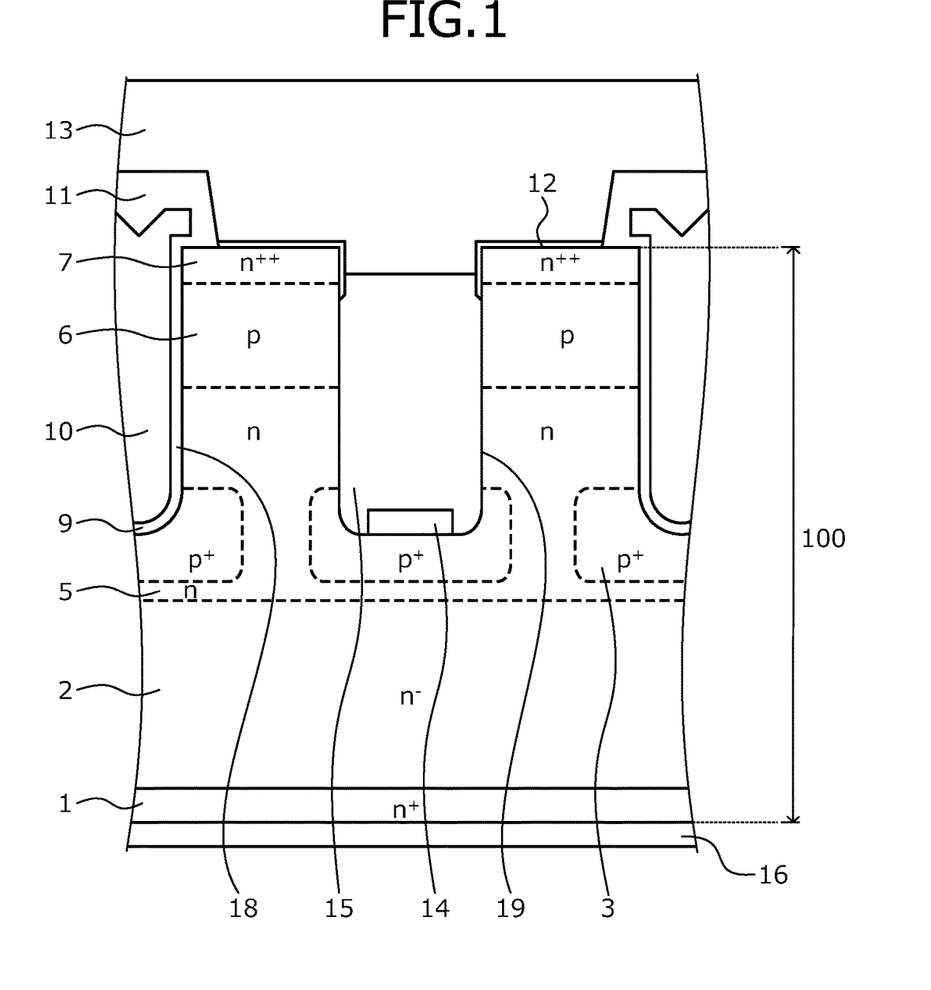
FIG. 1 is a cross-sectional view of a structure of a silicon carbide semiconductor device according to a first embodiment.

A semiconductor device according to embodiments of the present invention is configured using a semiconductor material (hereinafter, wide bandgap semiconductor material) having a bandgap wider than a bandgap of silicon. Here, description will be given taking, as an example, a structure of a semiconductor device (silicon carbide semiconductor device) in which, for example, silicon carbide (SiC) is used as a wide bandgap semiconductor material. FIG. 1 is a cross-sectional view of a structure of a silicon carbide semiconductor device according to a first embodiment. The silicon carbide semiconductor device according to the first embodiment depicted in FIG. 1 is a MOSFET that includes a MOS gate at a front surface side of a semiconductor base (silicon carbide base: semiconductor chip) 100 that contains silicon carbide.

The silicon carbide base 100 is formed by sequentially forming silicon carbide layers that constitute an $n^-$-type drift layer 2 and a p-type base layer (second semiconductor layer of a second conductivity type) 6, by epitaxial growth on an $n^+$-type supporting substrate ($n^+$-type silicon carbide substrate: semiconductor substrate of a first conductivity type) 1 containing silicon carbide. The MOS gate is configured by the p-type base layer 6, an $n^{++}$-type source region (first semiconductor region of the first conductivity type) 7, a gate trench 18, a gate insulating film 9, and a gate electrode 10. More specifically, in a surface layer on a source side (side facing toward a source electrode 12) of the $n^-$-type drift layer 2, an n-type region 5 is provided so as to contact the p-type base layer 6. In the present specification and claims, the $n^-$-type drift layer 2 and the n-type region 5 together may be referred to as a first semiconductor layer. The n-type region 5 is a current spreading layer (CSL) that reduces carrier spreading resistance. The n-type region 5, for example, is provided uniformly along a direction (hereinafter, lateral direction) parallel to a base front surface (front surface of the silicon carbide base 100).

In the n-type region 5, $p^+$-type regions 3 are selectively provided so as to contact a bottom of the gate trench 18 and a bottom of a contact trench 19 described hereinafter. The $p^+$-type regions 3 are provided from positions that from the base front surface, are deeper than an interface of the p-type base layer 6 and the n-type region 5, the $p^+$-type regions 3 being provided at a depth not reaching an interface of the n-type region 5 and the n⁻-type drift layer 2. Provision of the p⁺-type regions 3 enables pn junctions between the n-type region 5 and the p⁺-type regions 3 to be formed respectively near the bottom of the gate trench 18 and near the bottom of the contact trench 19. An impurity concentration of the p⁺-type regions 3 is higher than an impurity concentration of the p-type base layer 6. In the present specification and claims, the n-type portion of the n-type region 5 may be referred to as a second sub-region, and the p⁺-type regions 3 may be referred to as a second semiconductor region.

Further, a width of the p⁺-type regions 3 is wider than a width of the gate trench 18 and a width of the contact trench 19. The bottom of the gate trench 18 and the bottom of the contact trench 19 may each reach one of the p⁺-type regions 3, or each may be positioned in the n-type region 5 between the p-type base layer 6 and one of the p⁺-type regions 3, without contacting the p⁺-type regions 3.

In the p-type base layer 6, the n⁺⁺-type source region 7 is selectively provided. Further, although not depicted in FIG. 1, a p⁺⁺-type contact region may be provided so as to contact the n⁺⁺-type source region 7. A depth of the p⁺⁺-type contact region, for example, may be a same as or deeper than a depth of the n⁺⁺-type source region 7. In the present specification and claims, the p-type portion of the base layer 6 may be referred to as a first sub-region, and the n⁺⁺-type source region may be referred to as a first semiconductor region.

The gate trench 18 penetrates the n⁺⁺-type source region 7 and the p-type base layer 6 from the base front surface and reaches the n-type region 5 and the p⁺-type region 3. In the gate trench 18, the gate insulating film 9 is provided along a side wall of the gate trench 18, and the gate electrode 10 is provided on the gate insulating film 9. A source-side end of the gate electrode 10 may or may not protrude outwardly from the base front surface. The gate electrode 10 is electrically connected to a gate pad at a non-depicted part. An interlayer insulating film 11 is provided on the base front surface overall so as to cover the gate electrode 10 embedded in the gate trench 18.

The contact trench 19 is provided parallel to and between adjacent gate trenches 18. The contact trench 19 is provided separated from the gate trenches 18. The contact trench 19 penetrates the n⁺⁺-type source region 7 and the p-type base layer 6 from the base front surface and reaches the n-type region 5 and the p⁺-type region 3. At the bottom of the contact trench 19, an ohmic metal 14 that forms an ohmic contact with a silicon carbide semiconductor layer is provided. The ohmic metal 14 contains, for example, nickel (Ni).

Further, a Schottky metal 15 that forms a Schottky contact with a silicon carbide semiconductor layer is embedded in the contact trench 19. The Schottky metal 15 contains, for example, tungsten (W). Here, the Schottky metal 15 may occupy 30% or more of an internal volume of the contact trench 19. More specifically, the Schottky metal 15 is provided in the contact trench 19, from the bottom of the contact trench 19, to a position farther upward (toward the source electrode 12) than an interface of the p-type base layer 6 and the n⁺⁺-type source region 7. Further, the Schottky metal 15 is connected to the source electrode 12 and to a source electrode pad 13, and constitutes a built-in SBD.

In the contact trench 19, since the Schottky metal 15 is embedded, there is no need to deposit the Schottky metal 15 at a side wall of the contact trench 19. Therefore, even when the width of the contact trench 19 is reduced, the built-in SBD may be formed at the side wall of the contact trench 19. Further, the ohmic metal 14 is provided at the bottom of the contact trench 19, whereby the p⁺-type region 3 may be provided without decreasing the area of the Schottky contact of the side wall of the contact trench 19.

The source electrode (first electrode) 12 is in contact with the n⁺⁺-type source region 7 via a contact hole opened in the interlayer insulating film 11 and is electrically insulated from the gate electrode 10 by the interlayer insulating film 11. Further, in the contact trench 19, the source electrode 12 is provided to be in contact with the n⁺⁺-type source region 7 and a part of the p-type base layer 6. As a result, a mathematical area of contact of the n⁺⁺-type source region 7 and the source electrode 12, and a mathematical area of contact of the p-type base layer 6 and the source electrode 12 increase, whereby contact resistance may be reduced. Further, a reduction in size is enabled without an increase in contact resistance.

Between the source electrode 12 and the interlayer insulating film 11, for example, a barrier metal may be provided that prevents diffusion of metal atoms from the source electrode 12 toward the gate electrode 10. On the source electrode 12, the source electrode pad 13 is provided. On a rear surface (rear surface of the n⁺-type silicon carbide substrate 1 constituting an n⁺-type drain region) of the silicon carbide base 100, a drain electrode 16 (second electrode) is provided.

Figure 2:
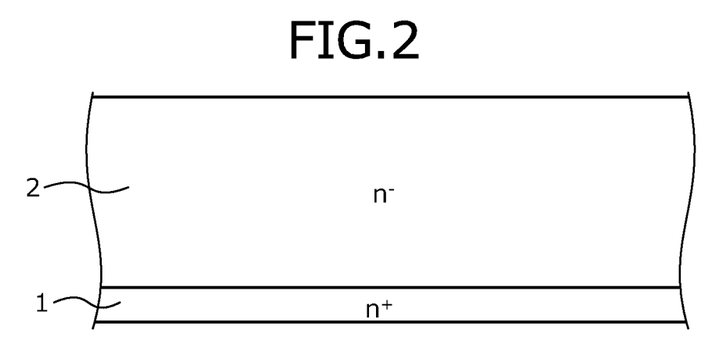
FIG. 2 is a cross-sectional view of the silicon carbide semiconductor device according to the first embodiment during manufacture.

A method of manufacturing the silicon carbide semiconductor device according to the first embodiment will be described, taking as an example, a case where 3300V trench type SiC-MOSFET is fabricated (manufactured). FIGS. 2, 3, 4, 5, 6, and 7 are cross-sectional views of the silicon carbide semiconductor device according to the first embodiment during manufacture. First, the n⁺-type silicon carbide substrate 1 constituting the n⁺-type drain region is prepared. Next, on the front surface of the n⁺-type silicon carbide substrate 1, the n⁻-type drift layer 2 is formed by epitaxial growth. For example, conditions of the epitaxial growth for forming the n⁻-type drift layer 2 may be set so that an impurity concentration of the n⁻-type drift layer 2 becomes about $3 \times 10^{15}/\text{cm}^3$. The state up to here is depicted in FIG. 2.

Figure 3:
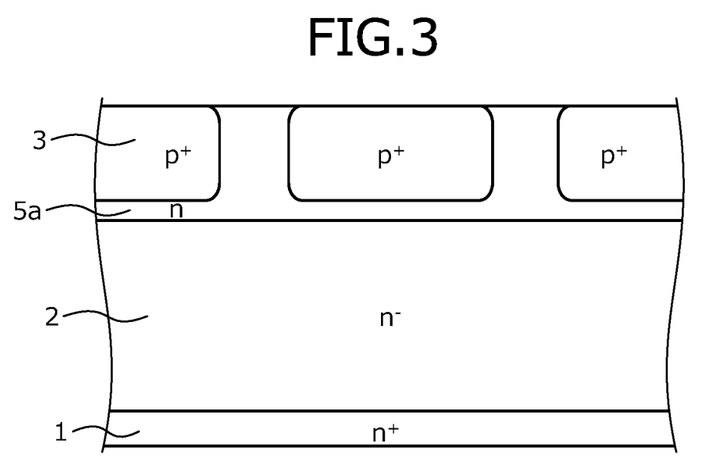
FIG. 3 is a cross-sectional view of the silicon carbide semiconductor device according to the first embodiment during manufacture.

Next, on the n⁻-type drift layer 2, a lower n-type region 5a is formed by epitaxial growth. For example, conditions of the epitaxial growth for forming the lower n-type region 5a may be set so that an impurity concentration of the lower n-type region 5a becomes about $1 \times 10^{17}/\text{cm}^3$. The lower n-type region 5a is a part of the n-type region 5. Next, the p⁺-type region 3 is selectively formed in a surface layer of the lower n-type region 5a by photolithography and ion implantation of a p-type impurity. For example, a dose amount at the time of the ion implantation for forming the p⁺-type region 3 may be set so that an impurity concentration of the p⁺-type region 3 becomes about $5 \times 10^{18}/\text{cm}^3$. The state up to here is depicted in FIG. 3.

Next, on the lower n-type region 5a and the p⁺-type regions 3, an upper n-type region 5b is formed by epitaxial growth. For example, conditions of the epitaxial growth for forming the upper n-type region 5b may be set so that an impurity concentration of the upper n-type region 5b becomes about a same as the impurity concentration of the lower n-type region 5a. The upper n-type region 5b is a part of the n-type region 5. The lower n-type region 5a and the upper n-type region 5b combined form the n-type region 5.

Next, on the upper n-type region 5b and the p⁺-type regions 3, the p-type base layer 6 is formed by epitaxial growth. For example, conditions of the epitaxial growth for forming the p-type base layer 6 may be set so that an impurity concentration of the p-type base layer 6 becomes about $4 \times 10^{17}/cm^3$.

Figure 4:
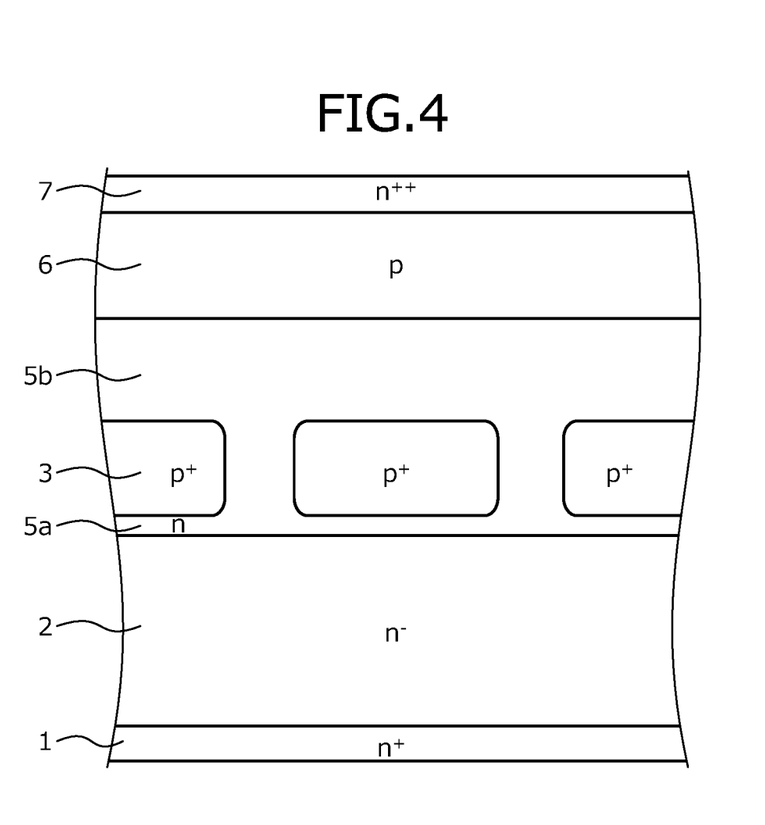
FIG. 4 is a cross-sectional view of the silicon carbide semiconductor device according to the first embodiment during manufacture.

Next, the $n^{++}$-type source region 7 is selectively formed in a surface layer of the p-type base layer 6 by photolithography and ion implantation of an n-type impurity. For example, a dose amount at the time of the ion implantation for forming the $n^{++}$-type source region 7 may be set so that an impurity concentration of the $n^{++}$-type source region 7 becomes about $3 \times 10^{20}/cm^3$. The state up to here is depicted in FIG. 4.

Next, on the base front surface, an oxide film is deposited (formed) and has a thickness of, for example, about 1.5 μm to 2.5 μm. Next, by photolithography and etching, the oxide film is patterned and a part of the oxide film corresponding to the contact trench 19 is removed. Next, after a resist mask (not depicted) used in patterning the oxide film is removed, etching is performed using, as a mask, the oxide film that remains, whereby the contact trench 19 is formed to a depth such that the bottom and a corner portion of the contact trench 19 reach the $p^+$-type region 3.

Next, after the oxide film that remains is removed by, for example, hydrofluoric acid (HF), on the base front surface, an oxide film is newly deposited and has a thickness of, for example, about 1.5 μm to 2.5 μm. Next, by photolithography and etching, the oxide film is patterned and a part of the oxide film corresponding to the gate trench 18 is removed. Next, after a resist mask used in patterning the oxide film is removed, etching is performed using, as a mask, the oxide film that remains, whereby the gate trench 18 is formed. A sequence in which the gate trench 18 and the contact trench 19 may be reversed, or the gate trench 18 and the contact trench 19 may be formed concurrently.

Next, after the oxide film that remains is removed, an oxide film ($SiO_2$ film) constituting the gate insulating film 9 and having a thickness of, for example, about 10 nm to 500 nm is deposited along an inner wall of the gate trench 18, and heat treatment in a nitrogen ($N_2$) atmosphere of a temperature of about 800 degrees C. to 1200 degrees C. is performed. Next, on the base front surface, for example, a polysilicon (poly-Si) layer is deposited so as to be embedded in the oxide film in the gate trench 18 and has a thickness of about 0.3 μm to 1.5 μm. Next, by photolithography and etching, the polysilicon is patterned and the gate electrode 10 is formed.

Next, on the base front surface, an oxide film having a thickness of, for example, 0.5 μm to 1.5 μm is deposited as the interlayer insulating film 11. Next, by photolithography and etching, the interlayer insulating film 11 is patterned and contact holes are formed. At this time, the interlayer insulating film 11 and the oxide film are patterned, exposing semiconductor regions. As a result, in openings (i.e., the contact holes) of a resist film used in patterning the interlayer insulating film 11, the $n^{++}$-type source region 7, the p-type base layer 6, the type drift layer 2, and the $p^+$-type region 3 are exposed at the base front surface and at an inner wall of the contact trench 19.

Figure 5:
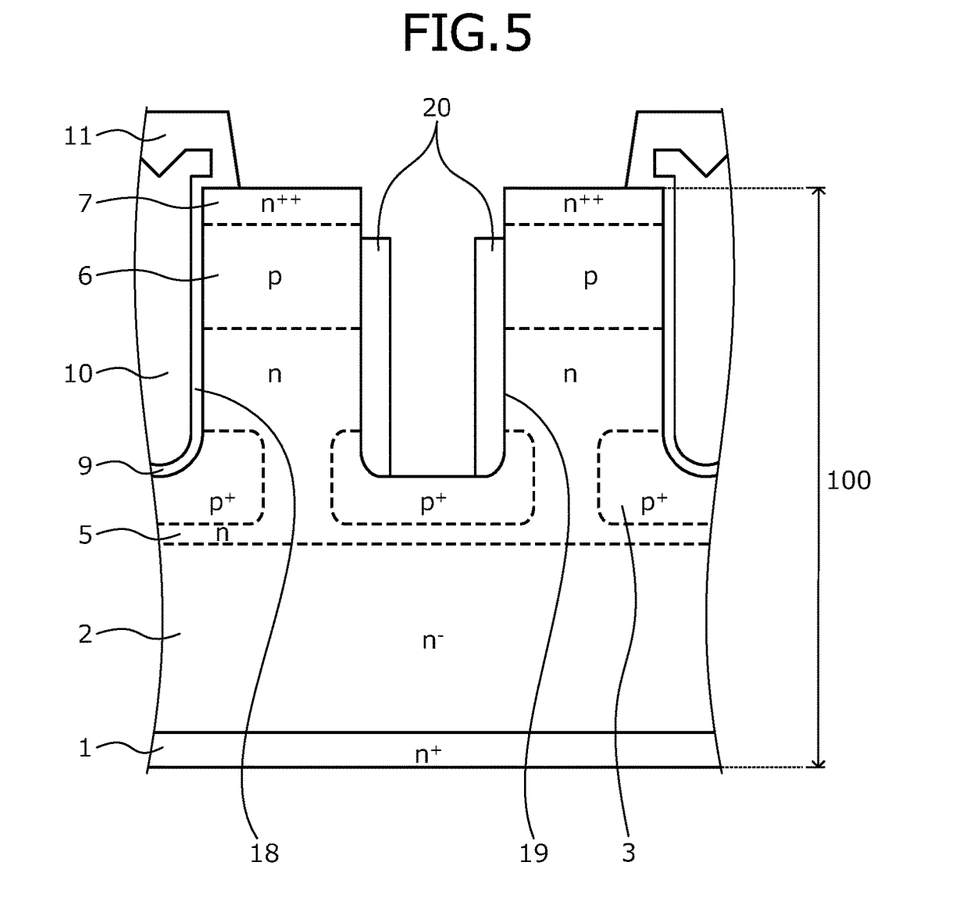
FIG. 5 is a cross-sectional view of the silicon carbide semiconductor device according to the first embodiment during manufacture.

Next, in a state in which the resist film used in patterning the interlayer insulating film 11 remains, a $SiO_2$ film 20 is deposited (formed) along the side wall of the contact trench 19, the side wall being exposed at an opening of the resist film. Further, when the oxide film that is deposited when the interlayer insulating film 11 is formed is patterned and left on the side wall of the contact trench 19 by photolithography and etching, the oxide film may be used as the $SiO_2$ film 20. The state up to here is depicted in FIG. 5.

Figure 6:
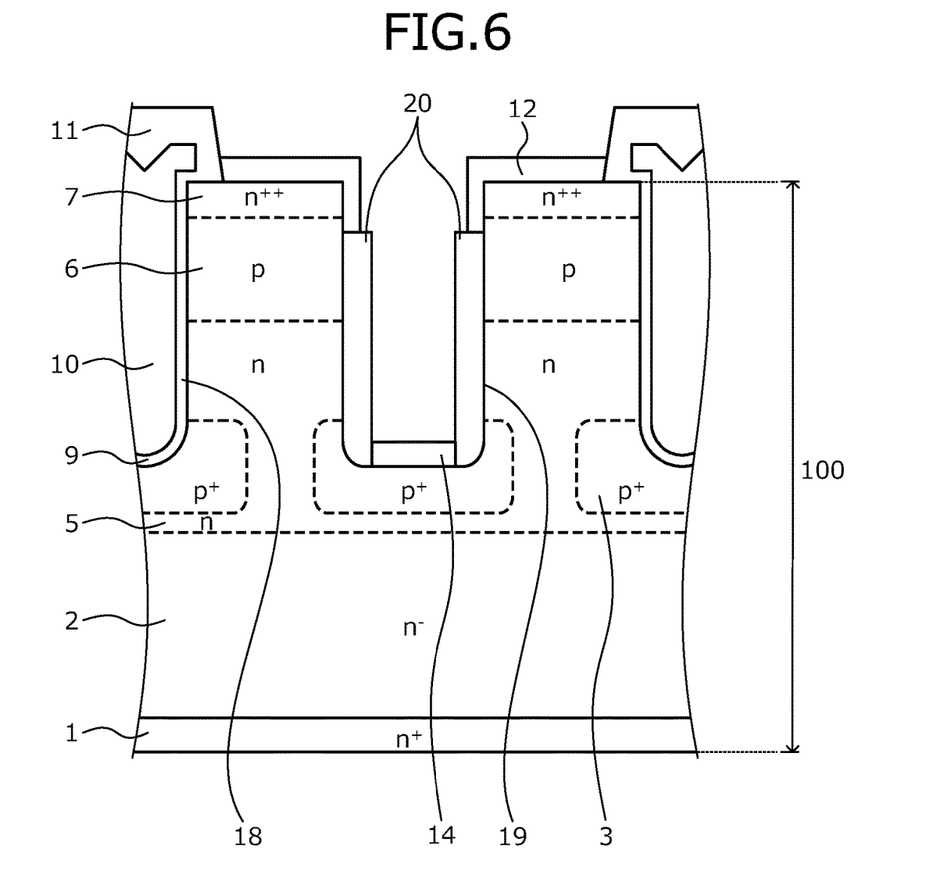
FIG. 6 is a cross-sectional view of the silicon carbide semiconductor device according to the first embodiment during manufacture.

Next, on the base front surface, a Ni film is deposited (formed). Next, for example, by adding heat treatment of a temperature of 400 degrees C. to 600 degrees C., a silicide layer is formed only at a contact part of SiC and Ni and an unreacted Ni layer on the $SiO_2$ film 20 is removed by wet processing. Thereafter, on the rear surface of the $n^+$-type silicon carbide substrate 1, at a contact part of the drain electrode 16, a metal film such as a nickel (Ni) film, a titanium (Ti) film, etc. is formed using sputtering deposition. The metal film may be a stacked combination of films such as a Ni film, a Ti film, etc. Again, a silicon carbide semiconductor area (the $p^+$-type region 3, the $n^{++}$-type source region 7, and the p-type base layer 6) and a Ni film are caused to react by sintering (heat treatment) at a temperature of about 1000 degrees C., whereby a nickel silicide film is formed. Concurrently, a silicide layer is formed on the rear surface. Next, the source electrode 12 and the ohmic metal 14 are formed. The state up to here is depicted in FIG. 6.

Figure 7:
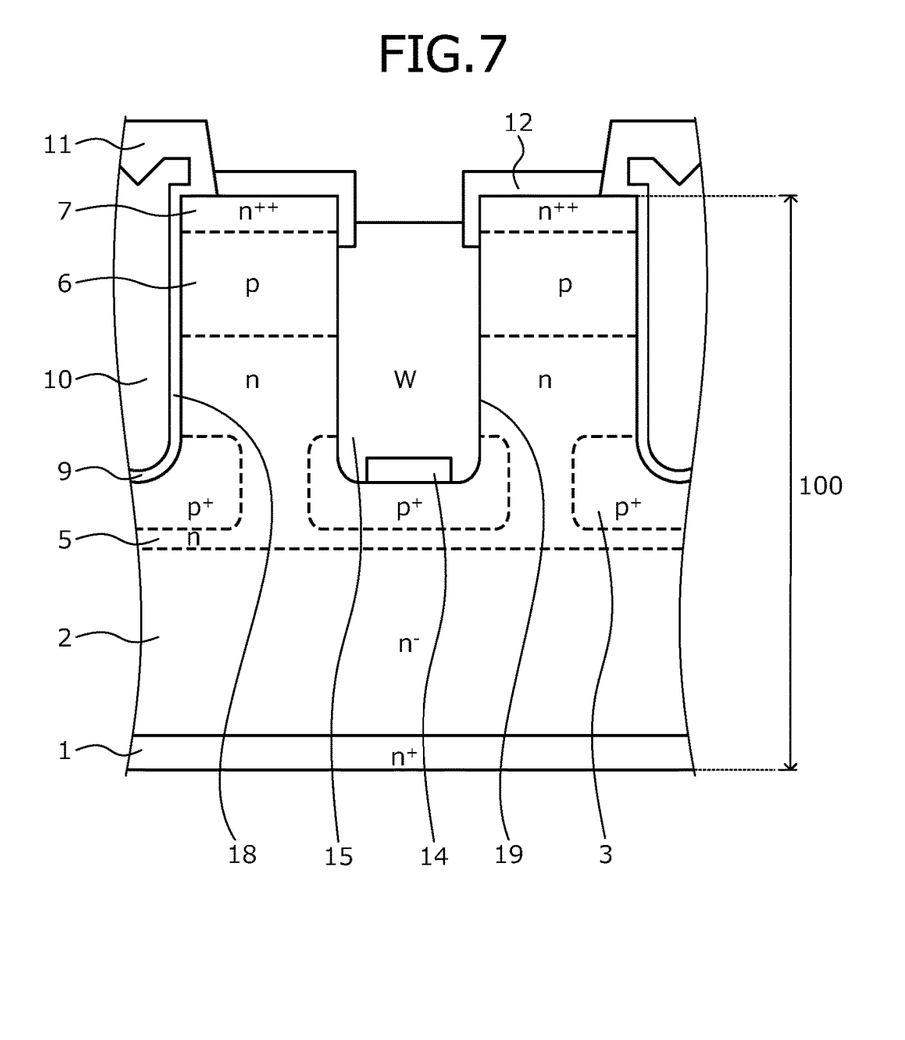
FIG. 7 is a cross-sectional view of the silicon carbide semiconductor device according to the first embodiment during manufacture.

Next, after the $SiO_2$ film 20 is removed by, for example, hydrofluoric acid (HF), tungsten (W) is deposited by, for example, a sputtering method so as to be embedded in the contact trench 19 and the deposited tungsten is etched, leaving the tungsten in the contact trench 19. At this time, etching may be performed so that the tungsten that remains is farther inward than the base front surface. Next, for example, a silicon carbide semiconductor area (the $p^+$-type region 3 and the p-type base layer 6) and the tungsten are caused to react by sintering (heat treatment) at a temperature of 400 degrees C. to 600 degrees C. and a Schottky contact is formed. The state up to here is depicted in FIG. 7.

Next, for example, an aluminum film is deposited (formed) by, for example, by a sputtering method, so as to cover the source electrode 12 and the interlayer insulating film 11, a thickness of the aluminum film being, for example, about 5 μm. Thereafter, the aluminum film is selectively removed, whereby the source electrode pad 13 is formed.

Next, a thick film constituted by, for example, a Ti film, a Ni film, and gold (Au) stacked in stated sequence is formed by electron beam (EB) deposition, forming the drain electrode 16. In this manner, the MOSFET depicted in FIG. 1 is completed.

As described, in the first embodiment, a Schottky metal forming a Schottky contact with a silicon carbide semiconductor layer is embedded in the contact trench. As a result, deposition of a Schottky metal at the inner wall of the contact trench becomes unnecessary, and even when the width of the contact trench is reduced, the built-in SBD may be formed at the side wall of the contact trench. Therefore, the cell pitch of a trench-type silicon carbide semiconductor device having a built-in SDB may be reduced and the ON resistance may be reduced.

Further, in the first embodiment, an ohmic metal forming an ohmic contact with a silicon carbide semiconductor layer is embedded at the bottom of the contact trench. Therefore, a Schottky metal and the source electrode may be connected without the mathematical area of the Schottky contact at the side wall of the contact trench being reduced.

Figure 8:
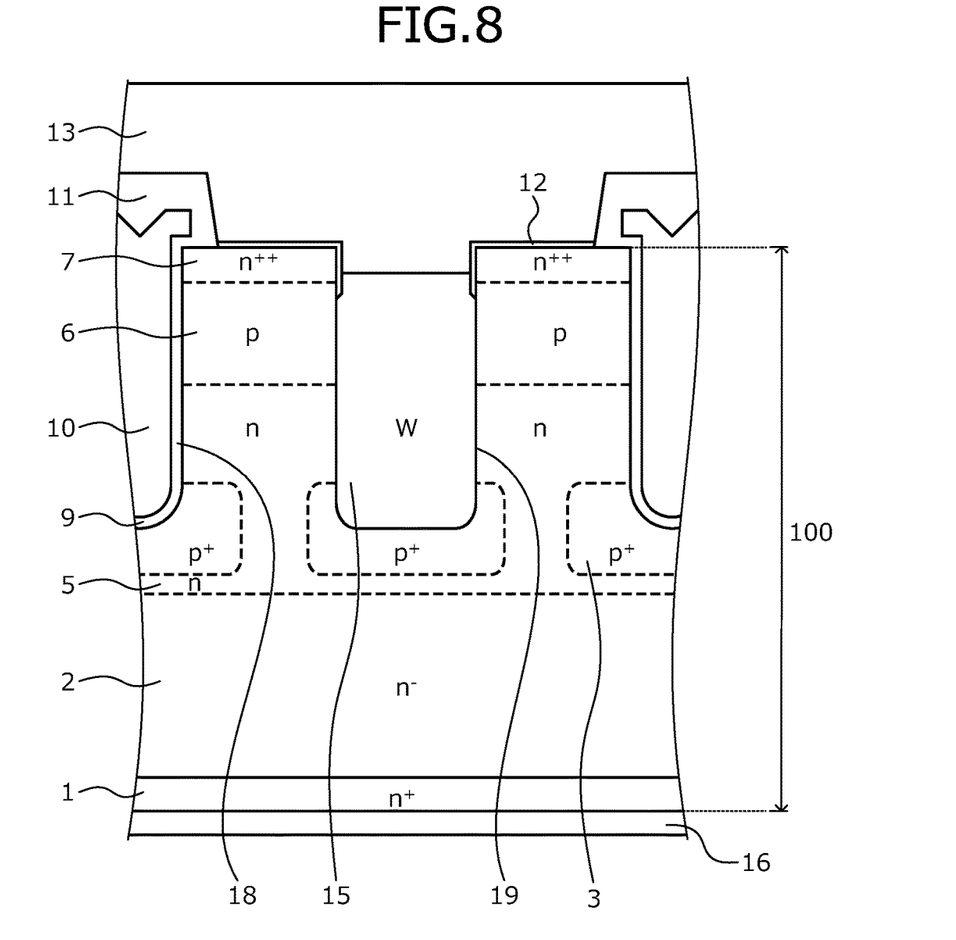
FIG. 8 is a cross-section view of a structure of the silicon carbide semiconductor device according to the second embodiment.

Next, a structure of the silicon carbide semiconductor device according to a second embodiment will be described. FIG. 8 is a cross-section view of a structure of the silicon carbide semiconductor device according to the second embodiment. The silicon carbide semiconductor device according to the second embodiment differs from the silicon carbide semiconductor device according to the first embodiment in that the ohmic metal 14 is not provided at the bottom of the contact trench 19.

Figure 9:
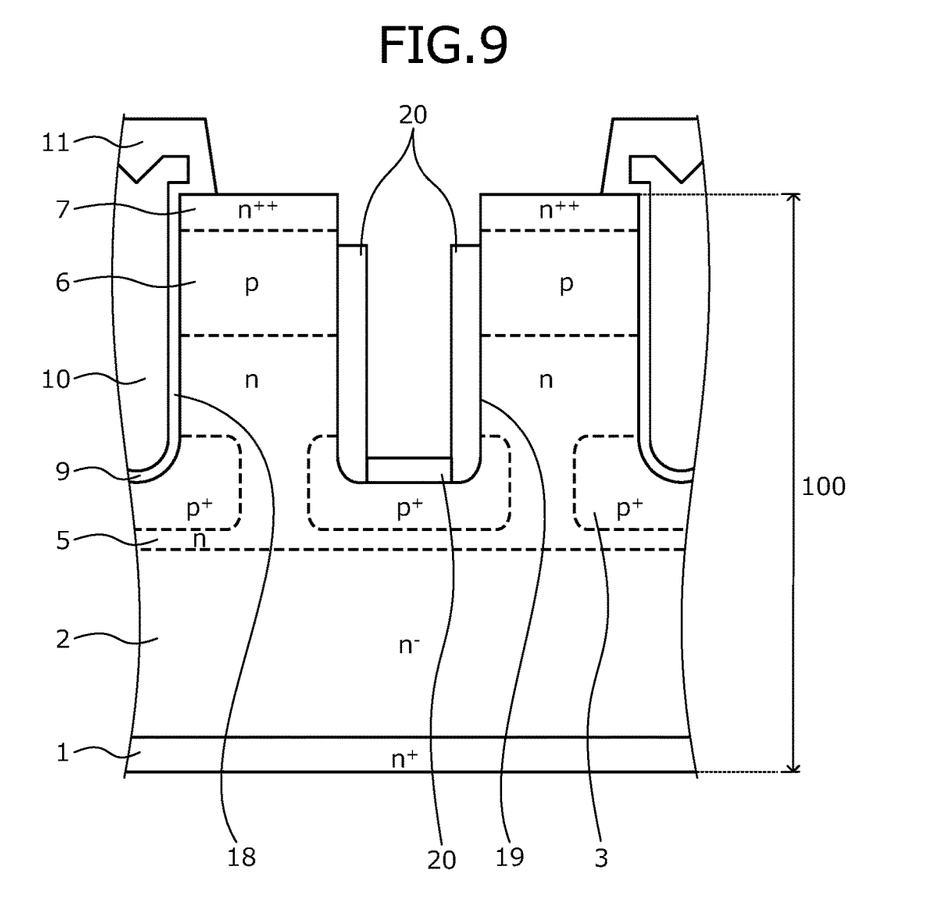
FIG. 9 is a cross-sectional view of the silicon carbide semiconductor device according to a second embodiment during manufacture.

A method of manufacturing the silicon carbide semiconductor device according to the second embodiment will be described. FIG. 9 is a cross-sectional view of the silicon carbide semiconductor device according to the second embodiment during manufacture. The method of manufacturing the silicon carbide semiconductor device according to the second embodiment, for example, differs from the method of manufacturing the silicon carbide semiconductor device according to the first embodiment in that the ohmic metal 14 is not formed. More specifically, first, similar to the first embodiment, processes from preparing the n$^+$-type silicon carbide substrate 1 and forming the n$^-$-type drift layer 2 by epitaxial growth to processes of patterning the interlayer insulating film 11 and forming a contact hole are sequentially performed (refer to FIGS. 2 to 5).

Next, in a state in which the resist film used in patterning the interlayer insulating film 11 remains, a SiO$_2$ film 20 is deposited (formed) along the side wall and the bottom of the contact trench 19, exposed at an opening of the resist film. Further, when the oxide film that is deposited when the interlayer insulating film 11 is formed is pattered and left on the side wall and the bottom of the contact trench 19 by photolithography and etching, the oxide film may be used as the SiO$_2$ film 20. The state up to here is depicted in FIG. 9.

Next, on the base front surface, a Ni film is deposited (formed). For example, by adding heat treatment of a temperature of 400 degrees C. to 600 degrees C., a silicide layer is formed only at a contact part of SiC and Ni, and an unreacted Ni layer on the SiO$_2$ film 20 is removed by wet processing. Thereafter, on the rear surface of the n$^+$-type silicon carbide substrate 1, at a contact part of the drain electrode 16, a metal film such as a nickel (Ni) film, a titanium (Ti) film, etc. is formed using sputtering deposition. The metal film may be a stacked combination of films such as a Ni film, a Ti film, etc. Again, a silicon carbide semiconductor area (the p$^+$-type region 3 and the n$^{++}$-type source region 7) and a Ni film are caused to react by sintering (heat treatment) at a temperature of about 1000 degrees C., whereby a nickel silicide film is formed. Concurrently, a silicide layer is formed on the rear surface. Next, the source electrode 12 is formed.

Thereafter, similarly to the first embodiment, the process of leaving tungsten in the contact trench 19 and subsequent processes are sequentially performed, whereby the MOSFET depicted in FIG. 8 is completed.

As described, according to the second embodiment, effects similar to those of the first embodiment may be obtained. Further, in the second embodiment, no ohmic metal is provided at the bottom of the contact trench. Since no ohmic metal is provided, the width of the contact trench may be made smaller than that in the first embodiment and the cell pitch of the semiconductor device may be further reduced.

Figure 10:
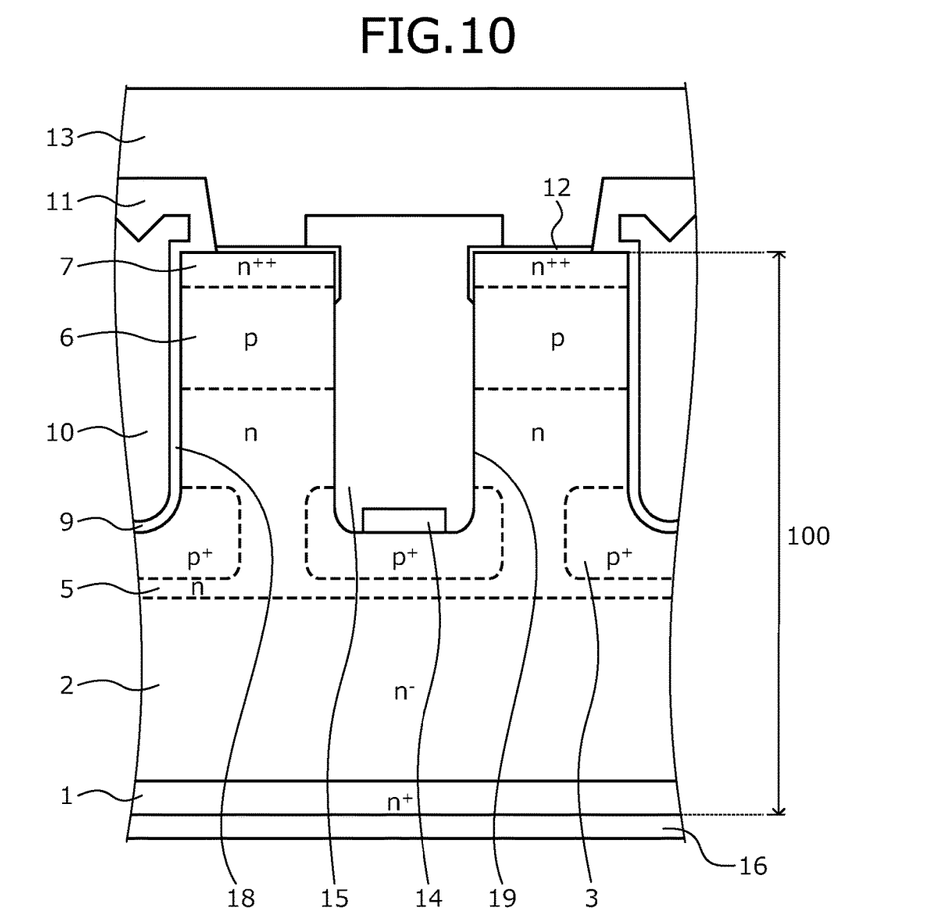
FIG. 10 is a cross-section view of a structure of the silicon carbide semiconductor device according to a third embodiment.

A structure of the silicon carbide semiconductor device according to a third embodiment will be described. FIG. 10 is a cross-section view of a structure of the silicon carbide semiconductor device according to the third embodiment. The silicon carbide semiconductor device according to the third embodiment differs from the silicon carbide semiconductor device according to the first embodiment in that the Schottky metal 15 completely fills the contact trench 19 and protrudes outwardly from the base front surface.

A method of manufacturing the silicon carbide semiconductor device according to the third embodiment will be described. The method of manufacturing a silicon carbide semiconductor device according to the third embodiment, for example, differs from the method of manufacturing the silicon carbide semiconductor device according to the first embodiment in that a process of forming the Schottky metal 15 is different. More specifically, first, similarly to the first embodiment, the processes from preparing the n$^+$-type silicon carbide substrate 1 and forming the n$^-$-type drift layer 2 by epitaxial growth to the processes of reacting a silicon carbide semiconductor area and a Ni film and forming a nickel silicide film are sequentially performed (refer to FIGS. 2 to 6).

Next, after the SiO$_2$ film 20 is removed by, for example, hydrofluoric acid (HF), on the base front surface, an oxide film is newly deposited and has a thickness of, for example, about 1.5 μm to 2.5 μm. Next, by photolithography and etching, the oxide film is patterned and a part of the oxide film corresponding to the contact trench 19 is removed. Next, tungsten is deposited by, for example, a sputtering method so as to be embedded in the contact trench 19 and the deposited tungsten is etched, leaving the tungsten in the contact trench 19. As this time, patterning and etching are performed so that the tungsten protrudes outwardly from the base front surface. Next, for example, a silicon carbide semiconductor area (the p$^+$-type region 3 and the p-type base layer 6) and the tungsten are caused to react by sintering (heat treatment) at a temperature of 400 degrees C. to 600 degrees C. and a Schottky contact is formed.

Thereafter, similarly to the first embodiment, the process of depositing (forming) an aluminum film and subsequent processes are sequentially performed, whereby the MOSFET depicted in FIG. 10 is completed.

As described, according to the third embodiment, effects similar to those of the first embodiment may be obtained. Further, in the third embodiment, the process of etching to leave the tungsten farther inward than the base front surface may be omitted.

Figure 11:
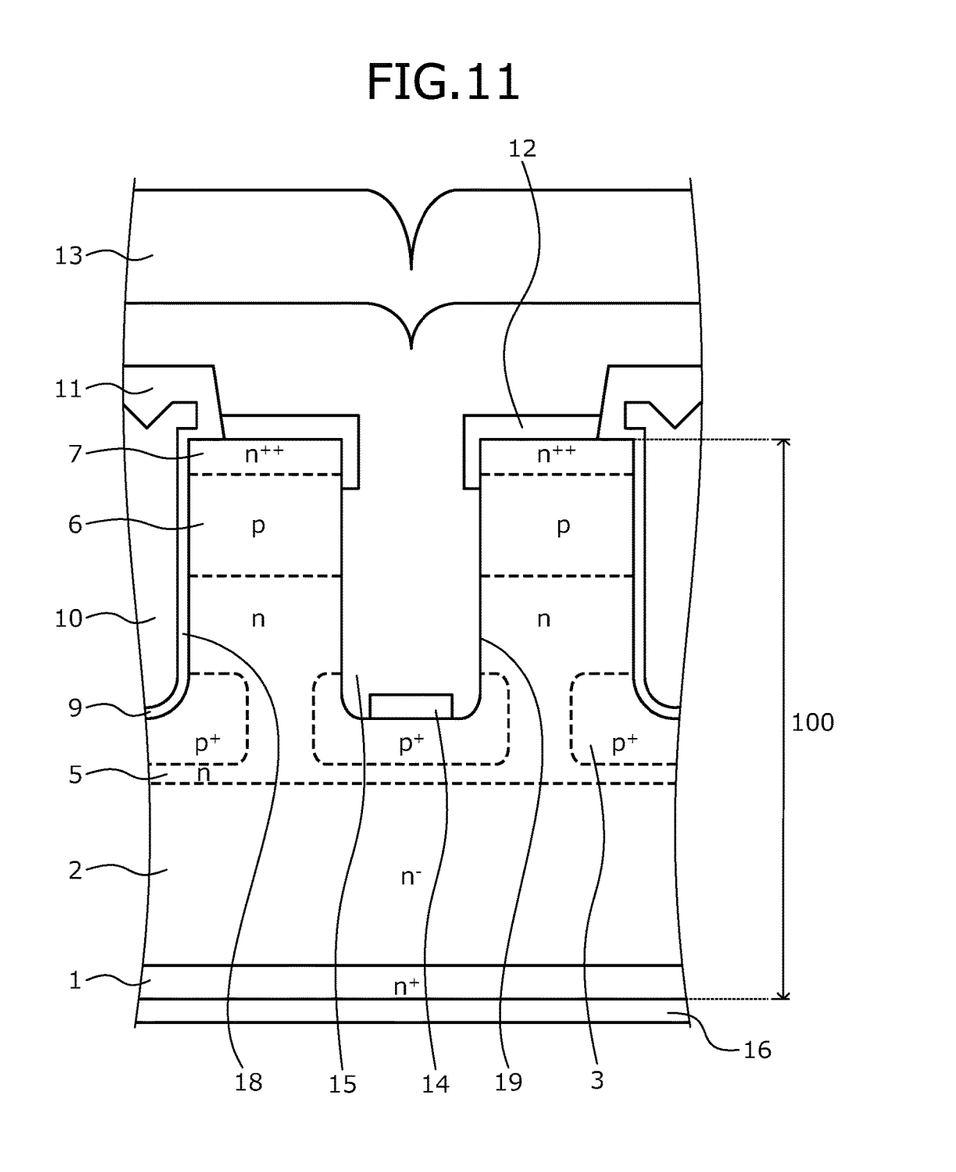
FIG. 11 is a cross-section view of a structure of the silicon carbide semiconductor device according to a fourth embodiment.

A structure of the silicon carbide semiconductor device according to a fourth embodiment will be described. FIG. 11 is a cross-section view of a structure of the silicon carbide semiconductor device according to the fourth embodiment. The silicon carbide semiconductor device according to the fourth embodiment differs from the silicon carbide semiconductor device according to the first embodiment in that the Schottky metal 15 completely fills the contact trench 19 and covers the base front surface.

A method of manufacturing the silicon carbide semiconductor device according to the fourth embodiment will be described. The method of manufacturing the silicon carbide semiconductor device according to the fourth embodiment, for example, differs from the method of manufacturing the silicon carbide semiconductor device according to the first embodiment in that a process of forming the Schottky metal 15 is different. More specifically, first, similarly to the first embodiment, the processes of preparing the n$^+$-type silicon carbide substrate 1 and forming the n$^-$-type drift layer 2 by epitaxial growth to the processes of reacting a silicon carbide semiconductor area and a Ni film and forming a nickel silicide film are sequentially performed (refer to FIGS. 2 to 6).

Next, after the SiO$_2$ film 20 is removed by, for example, hydrofluoric acid (HF), on the base front surface, an oxide film is newly deposited and has a thickness of, for example, about 1.5 μm to 2.5 μm. Next, by photolithography and etching, the oxide film is patterned and a part of the oxide film corresponding to the contact trench 19 is removed. Next, for example, by a sputtering method, a tungsten film is deposited (formed) on the base front surface and tungsten is embedded in the contact trench 19. Next, for example, a silicon carbide semiconductor area (the p$^+$-type region 3 and the p-type base layer 6) and the tungsten are caused to react by sintering (heat treatment) at a temperature of 400 degrees C. to 600 degrees C. and a Schottky contact is formed.

Thereafter, similarly to the first embodiment, the process of depositing (forming) an aluminum film and subsequent processes are sequentially performed, whereby the MOSFET depicted in FIG. 11 is completed.

As described, according to the fourth embodiment, effects similar to those of the first embodiment may be obtained. Further, in the fourth embodiment, the process of patterning after tungsten is deposited may be omitted.

In the embodiments of the present invention, various modifications within a scope not departing from the spirit of the invention are possible. For example, dimensions and impurity concentrations of regions, layers, etc. and formation conditions of regions, layers, etc. may be variously set according to required specifications, etc. Further, although a case in which a MOS gate structure is configured on a silicon carbide substrate containing silicon carbide is described as an example, without limitation hereto, a type (for example, gallium nitride (GaN), etc.) of the wide bandgap semiconductor material, orientation of a substrate main surface, etc. may be variously changed. Further, in the embodiments, although the first conductivity type is assumed to be an n-type and the second conductivity type is assumed to be a p-type, the present invention is similarly implemented when the first conductivity type is a p-type and the second conductivity type is an n-type.

According to the embodiments of the present invention, a Schottky metal that forms a Schottky contact with a silicon carbide semiconductor layer is embedded in a contact trench (second trench). As a result, a need to deposit a Schottky metal on the side wall of the contact trench is eliminated and even when the width of the contact trench is reduced, the built-in SBD may be formed at the side wall of the contact trench. Therefore, the cell pitch of a trench-type silicon carbide semiconductor device with a built-in SDB may be reduced and the ON resistance maybe reduced.

The semiconductor device and the method of manufacturing a semiconductor device of the embodiments achieve an effect in that the width of a contact trench in which a built-in SBD is formed at a side wall thereof may be reduced and the ON resistance may be reduced.

Thus, the semiconductor device and the method of manufacturing a semiconductor device according to the embodiments of the present invention are useful for power semiconductor devices used in power converting equipment and power supply devices such as in industrial machines, and are particularly suitable for silicon carbide semiconductor devices of a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
semiconductor substrate of a first conductivity type;
a first semiconductor layer having a first sub-region of the first conductivity type provided on a front surface of the semiconductor substrate;
a second semiconductor layer having a second sub-region of a second conductivity type, the second semiconductor layer provided on a first side of the first semiconductor layer opposite a second side of the first semiconductor layer facing the semiconductor substrate;
a first semiconductor region of the first conductivity type selectively provided in the second semiconductor layer, an impurity concentration of the first semiconductor region being higher than an impurity concentration of the semiconductor substrate;
a first trench penetrating the first semiconductor region and the second semiconductor layer, and reaching the first semiconductor layer;
a gate electrode provided in the first trench, on a gate insulating film;
an interlayer insulating film provided on the gate electrode;
a first electrode in contact with the first semiconductor region and the second semiconductor layer;
a second electrode provided on a rear surface of the semiconductor substrate;
a second trench separated from the first trench, the second trench penetrating the first semiconductor region and the second semiconductor layer, and reaching the first semiconductor layer;
a first metal electrode embedded in the second trench, the first metal electrode forming a Schottky contact with the first semiconductor layer at a side wall of the second trench; and
a second metal electrode forming an ohmic contact with the first semiconductor layer at a bottom of the second trench.

2. The semiconductor device according to claim 1, wherein
the first metal electrode occupies at least 30% of an internal volume of the second trench.

3. The semiconductor device according to claim 1, wherein
the first metal electrode is embedded from a bottom of the second trench to at least an interface of the second semiconductor layer and the first semiconductor region.

4. The semiconductor device according to claim 1, wherein
the first metal electrode protrudes outwardly from the second trench.

5. The semiconductor device according to claim 1, wherein
the first metal electrode protrudes outwardly from the second trench and covers the interlayer insulating film and the first electrode.

* * * * *